(12) United States Patent
Mizugaki

(10) Patent No.: US 6,519,200 B2
(45) Date of Patent: Feb. 11, 2003

(54) SEMICONDUCTOR DEVICE, METHOD FOR REFRESHING THE SAME, AND ELECTRONIC EQUIPMENT

(75) Inventor: Koichi Mizugaki, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/907,755

(22) Filed: Jul. 19, 2001

(65) Prior Publication Data

US 2002/0018388 A1 Feb. 14, 2002

(30) Foreign Application Priority Data

Jul. 21, 2000 (JP) .................................. 2000-220497

(51) Int. Cl.[7] .............................................. G11C 8/00
(52) U.S. Cl. ................................... 365/222; 365/233
(58) Field of Search ............................ 365/222, 230.03, 365/233

(56) References Cited

U.S. PATENT DOCUMENTS 4,758,993 A * 7/1988 Takemae .................. 365/222
5,999,474 A   12/1999 Leung et al. ............. 365/222
6,285,616 B1 * 9/2001 Ikabata .................... 365/222

OTHER PUBLICATIONS

U.S. patent application Ser. No. 09/907,769, filed Jul. 19, 2001, Mizugaki.

* cited by examiner

Primary Examiner—Son Mai
(74) Attorney, Agent, or Firm—Oliff & Berridge, PLC

(57) ABSTRACT

A semiconductor device includes a memory cell array which is divided into four blocks, specifically, a block (0), a block (1), a block (2), and a block (3). In this semiconductor device, during a period in which the data read or write is performed in one block, refreshing is executed in all of the other blocks.

16 Claims, 11 Drawing Sheets

SEMICONDUCTOR DEVICE, METHOD FOR REFRESHING THE SAME, AND ELECTRONIC EQUIPMENT

Japanese patent application no. 2000-220497, filed Jul. 21, 2000 is hereby incorporated by reference in its entirety.

FIELD OF THE INVENTION

The present invention relates to a semiconductor device which stores data by storing an electric charge, a method for refreshing the semiconductor device, and electronic equipment equipped with the semiconductor device.

DESCRIPTION OF RELATED ART

A VSRAM (Virtually Static RAM) is one type of semiconductor memory. Although memory cells of the VSRAM are the same as memory cells of a DRAM, the VSRAM does not need multiplexing of the column address and the row address. Moreover, the VSRAM can be used without taking refreshing into consideration. Specifically, the VSRAM is provided with transparency of refreshing.

SUMMARY OF THE INVENTION

An object of the present invention is to provide a semiconductor device including a memory cell array, in which memory cells for which refreshing is needed are arranged in an array, a method for refreshing the semiconductor device, and electronic equipment equipped with the semiconductor device.

One aspect of the present invention provides a method for refreshing a semiconductor device including a memory cell array, in which memory cells for which refreshing is needed are arranged in an array,
  wherein the memory cell array is divided into a plurality of blocks, and
  wherein data read or write in one block among the plurality of blocks and refreshing in at least one of the other blocks among the plurality of blocks are performed concurrently.

The term "two events are performed concurrently" used in this specification means that at least part of the events overlaps each other in time during the execution of the events.

Another aspect of the present invention provides a semiconductor device including a memory cell array, in which memory cells for which refreshing is needed are arranged in an array,
  wherein the memory cell array is divided into a plurality of blocks, and
  wherein the semiconductor device includes a control section which controls data read or write in one block among the plurality of blocks and refreshing in at least one of the other blocks among the plurality of blocks to be performed concurrently.

DETAILED DESCRIPTION OF THE EMBODIMENT

Figure 1:
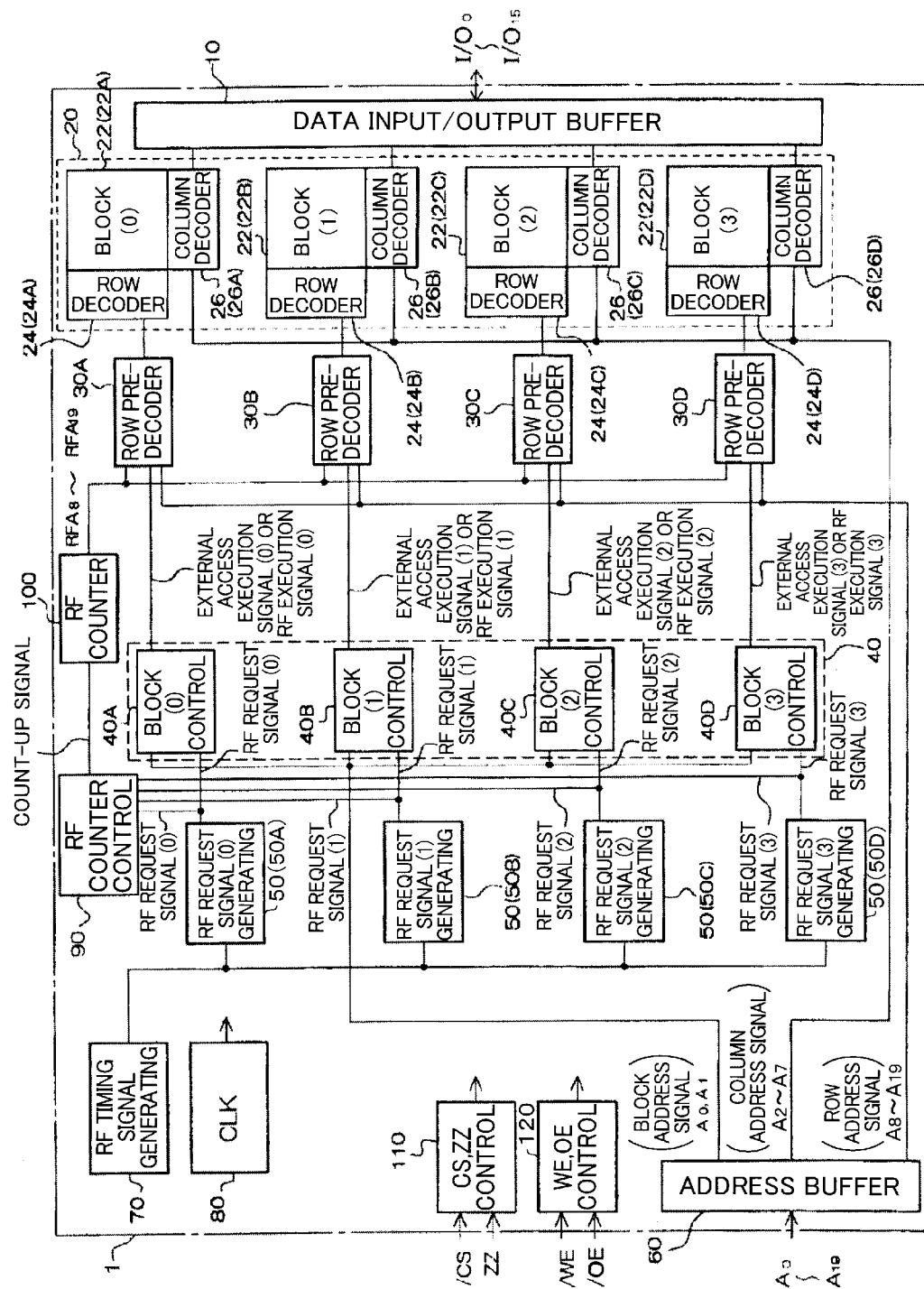
FIG. 1 is a block diagram of a semiconductor device according to the present embodiment.

1. Overview of embodiments
1.1 One Embodiment of the Present Invention

One embodiment of the present invention provides a method for refreshing a semiconductor device including a memory cell array, in which memory cells for which refreshing is needed are arranged in an array,
  wherein the memory cell array is divided into a plurality of blocks, and
  wherein data read or write in one block among the plurality of blocks and refreshing in at least one of the other blocks among the plurality of blocks are performed concurrently.

According to this method for refreshing the semiconductor device, since the data read or write (external access) is performed in one block while executing refreshing in the other blocks, the semiconductor device can be operated efficiently.

The method for refreshing the semiconductor device according to the present embodiment further includes any of the following features.

(1) The data read or write in the one block may be synchronized with the refreshing in the at least one of the other blocks using a clock signal generated inside the semiconductor device.

In this feature, refreshing can be performed without taking external devices (CPU, for example) into consideration. Therefore, it is advantageous in the case of making a system by combining this semiconductor device and other external devices.

(2) During the data read or write in the one block, the refreshing may be performed in the at least one of the other blocks.

This ensures that refreshing is not performed in one block when the data read or write is started in this block, thereby preventing a delay in the data read or write.

(3) A process for starting the data read or write in the one block may be synchronized with a process for starting the refreshing in the at least one of the other blocks.

This prevents refreshing from being performed in one block when the data read or write is performed in this block.

(4) The refreshing may be performed in the one block after a completion of the data read or write in the one block.

This enables refreshing to be performed in all the blocks.

(5) The data read or write in the one block and the refreshing in all of the other blocks may be performed concurrently.

(6) The semiconductor device may comprise a VSRAM (Virtually Static RAM).

1.2 Another Embodiment of the Present Invention

Another embodiment of the present invention provides a semiconductor device including a memory cell array, in which memory cells for which refreshing is needed are arranged in an array, wherein the memory cell array is divided into a plurality of blocks, and wherein the semiconductor device includes a control section which controls data read or write in one block among the plurality of blocks and refreshing in at least one of the other blocks among the plurality of blocks to be performed concurrently.

According to this semiconductor device, since the data read or write (external access) is performed in one block while executing refreshing in the other blocks, the semiconductor device can be operated efficiently. The control section includes block controls, for example.

The semiconductor device according to the present embodiment further includes any of the following features.

(1) The control section may comprise a plurality of block controls of which number corresponds to the number of blocks, and each of the block controls may comprise:
an external-access-execution-signal-generating section which generates a first signal for directing the data read or write to be executed; and
a refresh-execution-signal-generating section which generates a second signal for directing the refreshing to be executed.

(2) Each of the block controls may generate the first or second signal according to a block address signal.

(3) The semiconductor device may comprise a clock signal generating section which generates a clock signal for the data read or write in the one block to be synchronized with the refreshing in the at least one of the other blocks.

In this feature, refreshing can be performed without taking external devices (CPU, for example) into consideration. Therefore, it is advantageous in the case of making a system by combining the semiconductor device of the present embodiment and external devices.

(4) The control section may comprise:
a block selection section which selects the one block for performing the data read or write; and
a block control section for the refreshing in the at least one of the other blocks to be executed during a period in which the one block is selected.

This prevents refreshing from being performed in one block when the data read or write is performed in this block, thereby preventing a delay in the data read or write. The block selection section includes an address buffer, for example. The block control section includes block controls, for example.

(5) The control section may comprise:
an external-access-execution-signal-generating section which generates a first signal for directing the data read or write to be executed in the one block;
a refresh-execution-signal-generating section which generates a second signal for directing the refreshing to be executed in the at least one of the other blocks; and
a clock signal generating section which generates a clock signal for the first and second signals to be synchronized.

This prevents refreshing from being performed in one block when the data read or write is performed in this block.

(6) The control section may control the data read or write in the one block and the refreshing in all of the other blocks to be performed concurrently.

(7) The semiconductor device may comprise a VSRAM (Virtually Static RAM).

1.3 Still Another Embodiment of the Present Invention

Still another embodiment of the present invention provides electronic equipment having the semiconductor device.

2. Detailed Description of Embodiments

Detailed embodiments of the present invention are described below with reference to the drawings. The present embodiment illustrates an example in which the present invention is applied to a VSRAM.

2.1 Structure of Semiconductor Device

The structure of the present embodiment is described below. FIG. 1 is a block diagram showing a semiconductor device 1 according to the present embodiment. The semiconductor device 1 includes a data input/output buffer 10, a memory cell array 20, and an address buffer 60.

16-bit data ($I/O_0$ to $I/O_{15}$) is input to or output from the data input/output buffer 10.

The memory cell array 20 includes a plurality of memory cells arranged in an array. Each memory cell includes an access transistor which is an n-type MOS transistor, and a capacitor for storing data. The memory cell array 20 is divided into four blocks 22, specifically, a block (0) 22A, a block (1) 22B, a block (2) 22C, and a block (3) 22D. In the present embodiment, the memory cell array 20 is divided into at least two blocks. The number of blocks may be an odd number or an even number.

Each of the blocks 22 includes a plurality of word lines, a plurality of pairs of bit lines intersecting the word lines, and the memory cells provided corresponding to the intersection points of the word lines and the pairs of bit lines. In the case where the memory cell array 20 is 16 Mbits, each block 22 is 4 Mbits, for example.

Each of the blocks 22 includes a row decoder 24 and a column decoder 26. The word line is selected by the row decoder 24. The pair of bit lines is selected by the column decoder 26.

Address signals $A_0$ to $A_{19}$ which are access signals from the outside are input to the address buffer 60. The address signals $A_0$ and $A_1$ are block address signals. The block 22 in which the read or write operation is performed is selected by the address signals $A_0$ and $A_1$. Specifically, the block (0) 22A is selected when the address signals ($A_0$, $A_1$) are ("L", "L"). The block (1) 22B is selected when the address signals ($A_0$, $A_1$) are ("H", "L"). The block (2) 22C is selected when the address signals ($A_0$, $A_1$) are ("L", "H"). The block (3) 22D is selected when the address signals ($A_0$, $A_1$) are ("H", "H"). The address signal $A_0$ is a signal of the least significant bit of the address signal. The address signal $A_1$ is a signal of the next least significant bit of the address signal.

The address signals $A_2$ to $A_7$ are column address signals. The column address of each block 22 is selected by the address signals $A_2$ to $A_7$. The address signals $A_8$ to $A_{19}$ are row address signals. The row address of each block 22 is selected by the address signals $A_8$ to $A_{19}$. The address signals $A_0$ to $A_{19}$ are assigned to the block address signals, column address signals, and row address signals in that order. However, the order may be different therefrom. The address buffer 60 is described later in detail.

The semiconductor device 1 further includes four RF (refresh) request signal generating circuits 50, RF (refresh) timing signal generating circuit 70, and a clock 80.

The RF timing signal generating circuit 70 includes a ring oscillation circuit and generates an RF timing signal. The RF timing signal is for an RF request signal to be generated periodically. The timing of the generation of the RF request signal is determined by the RF timing signal.

The number of the RF request signal generating circuits 50 corresponds to the number of the blocks 22. The RF timing signal and a clock signal are input to the RF request signal generating circuits 50 respectively from the RF timing signal generating circuit 70 and the clock 80. The RF (refresh) request signal is output from the RF request signal generating circuits 50. Specifically, an RF request signal (0) is output from an RF request signal (0) generating circuit 50A. An RF request signal (1) is output from an RF request signal (1) generating circuit 50B. An RF request signal (2) is output from an RF request signal (2) generating circuit 50C. An RF request signal (3) is output from an RF request signal (3) generating circuit 50D.

The semiconductor device 1 further includes a control section 40. The control section 40 includes the same number of block controls as the number of the blocks 22. In the present embodiment, the control section 40 includes four block controls, specifically, a block (0) control 40A, a block (1) control 40B, a block (2) control 40C, and a block (3) control 40D. The block address signals $A_0$ and $A_1$ are input to each block control. The RF request signal (0) is input to the block (0) control 40A. The RF request signal (1) is input to the block (1) control 40B. The RF request signal (2) is input to the block (2) control 40C. The RF request signal (3) is input to the block (3) control 40D.

An external access execution signal or RF (refresh) execution signal is output from the block controls. Specifically, an external access execution signal (0) or RF execution signal (0) is output from the block (0) control 40A. An external access execution signal (1) or RF execution signal (1) is output from the block (1) control 40B. An external access execution signal (2) or RF execution signal (2) is output from the block (2) control 40C. An external access execution signal (3) or RF execution signal (3) is output from the block (3) control 40D.

In the case where the block address signals ($A_0$, $A_1$) are ("L", "L") when the RF request signals (0) to (3) are generated, for example, the external access execution signal (0) is output from the block (0) control 40A so that the block (0) 22A is selected. The RF execution signals (1) to (3) are respectively output from other block controls 40B to 40D. Thus, data is read from or written into the block (0) 22A, and the memory cells connected to the word line in the same row is refreshed in other at least one of the blocks which are the block (1) 22B, block (2) 22C, and block (3) 22D. The block controls are described later in detail.

The semiconductor device 1 further includes row predecoders 30A to 30D and an RF (refresh) counter 100. A signal for selecting the word line is supplied by the row predecoders 30A to 30D. Refresh address signals $RFA_8$ to $RFA_{19}$ output from the RF counter 100 and the row address signals $A_8$ to $A_{19}$ are input to the row predecoders 30A to 30D. An output signal (external access execution signal (0) or RF execution signal (0)) from the block (0) control 40A is input to the row predecoder 30A. An output signal from the block (1) control 40B is input to the row predecoder 30B. An output signal from the block (2) control 40C is input to the row predecoder 30C. An output signal from the block (3) control 40D is input to the row predecoder 30D. The row predecoders 30A to 30D are described later in detail.

An output signal from the row predecoder 30A is input to the row decoder 24A. An output signal from the row predecoder 30B is input to the row decoder 24B. An output signal from the row predecoder 30C is input to the row decoder 24C. An output signal from the row predecoder 30D is input to the row decoder 24D.

The semiconductor device 1 further includes an RF (refresh) counter control 90. The RF request signals (0) to (3) output from the RF request signal generating circuits 50 are input to the RF counter control 90. The RF counter control 90 outputs a count-up signal. The count-up signal is input to the RF counter 100. The RF counter control 90 is described later in detail.

The semiconductor device 1 further includes a CS,ZZ control 110. Before describing the CS,ZZ control 110, an operation cycle and a standby cycle are described. The semiconductor device 1 has an operation cycle and a standby cycle. The semiconductor device 1 allows data to be read or written in the operation cycle. The semiconductor device 1 does not allow data to be read or written in the standby cycle. Note that refreshing is also performed in the semiconductor device 1 in the standby cycle.

A chip-select signal /CS and a snooze signal ZZ are input to the CS,ZZ control 110 from the outside. The semiconductor device 1 enters the operation cycle when the chip-select signal /CS is set to "L". The semiconductor device 1 enters the standby cycle when the chip-select signal /CS is set to "H". The semiconductor device 1 enters a low power consumption state in the standby cycle when the snooze signal ZZ is set to "L". This makes the power consumption of the semiconductor device 1 to be minimum. The semiconductor device 1 enters the wait state in the standby cycle when the snooze signal ZZ is set to "H".

The semiconductor device 1 further includes a WE,OE control 120. A write-enable signal /WE and an output enable signal /OE are input to the WE,OE control 120.

2.2 Address Buffer

Figure 2:
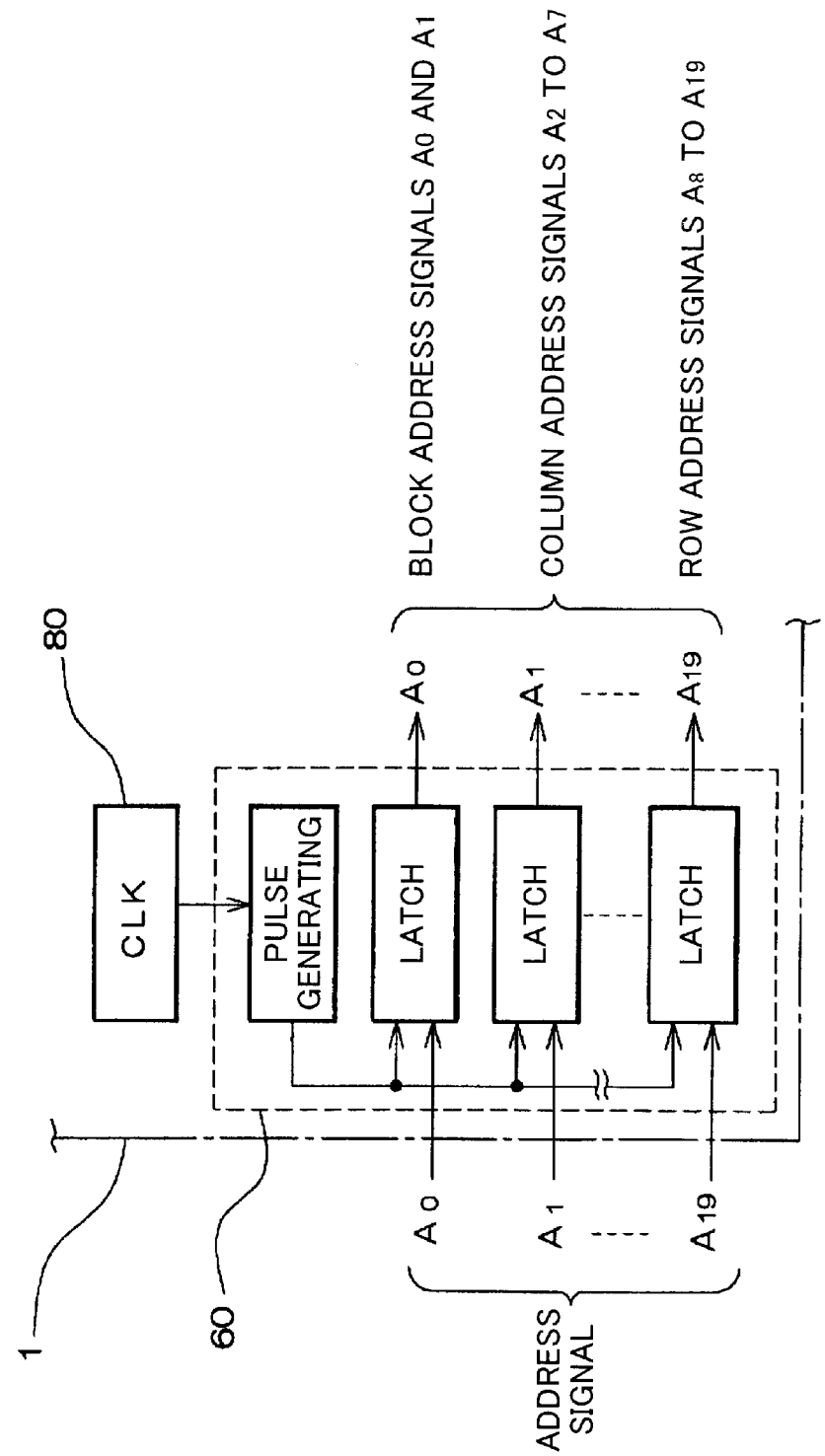
FIG. 2 is a block diagram showing an address buffer and circuits relating to the address buffer.
Figure 3:
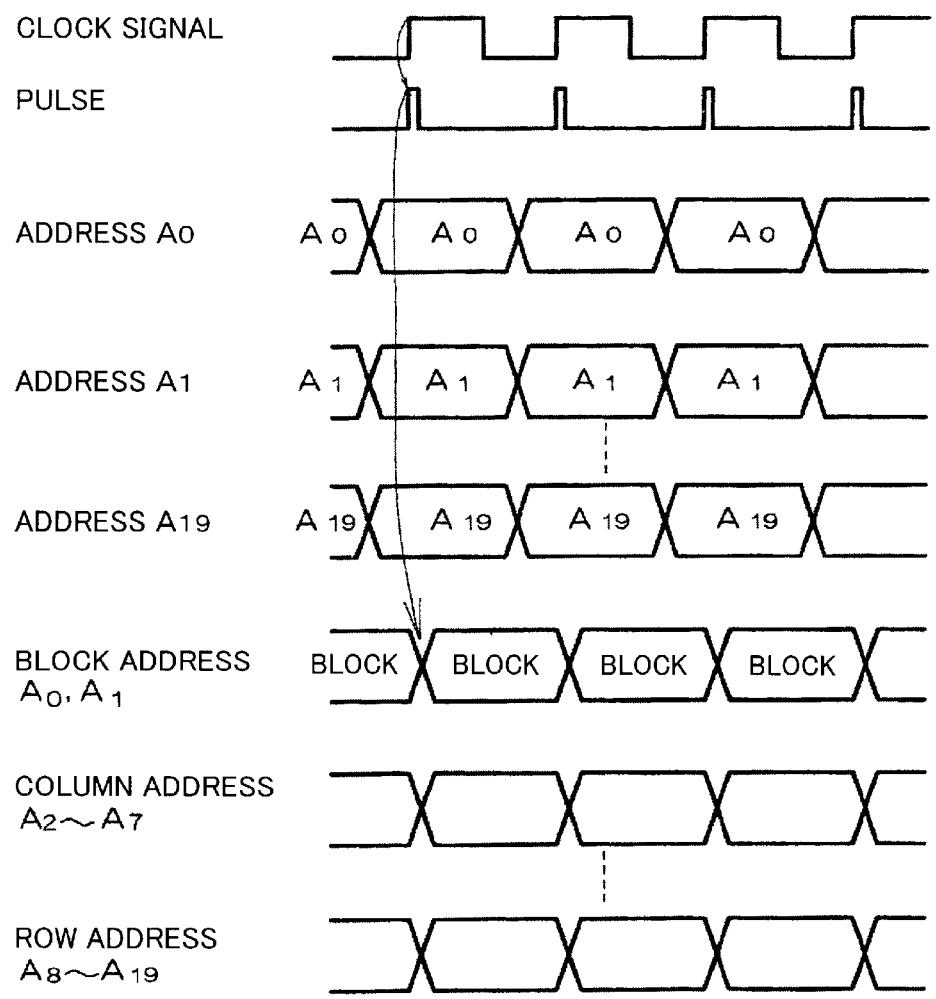
FIG. 3 is a timing chart for describing the operation of the address buffer.

The address buffer 60 is described below in detail using FIGS. 2 and 3. FIG. 2 is a block diagram showing the address buffer 60 and circuits relating to the address buffer 60. FIG. 3 is a timing chart for describing the operation of the address buffer 60. The address buffer 60 includes 20 latch circuits corresponding to the number of the address signals $A_0$ to $A_{19}$.

A pulse generating circuit detects the leading edge of the clock signal from the clock 80 and generates a pulse. The address signals $A_0$ to $A_{19}$ are respectively input to the corresponding latch circuits. The latch circuits output the block address signals $A_0$ and $A_1$, column address signals $A_2$ to $A_7$, and row address signals $A_8$ to $A_{19}$ in synchronization with the pulse.

2.3 Block Control

Figure 4:
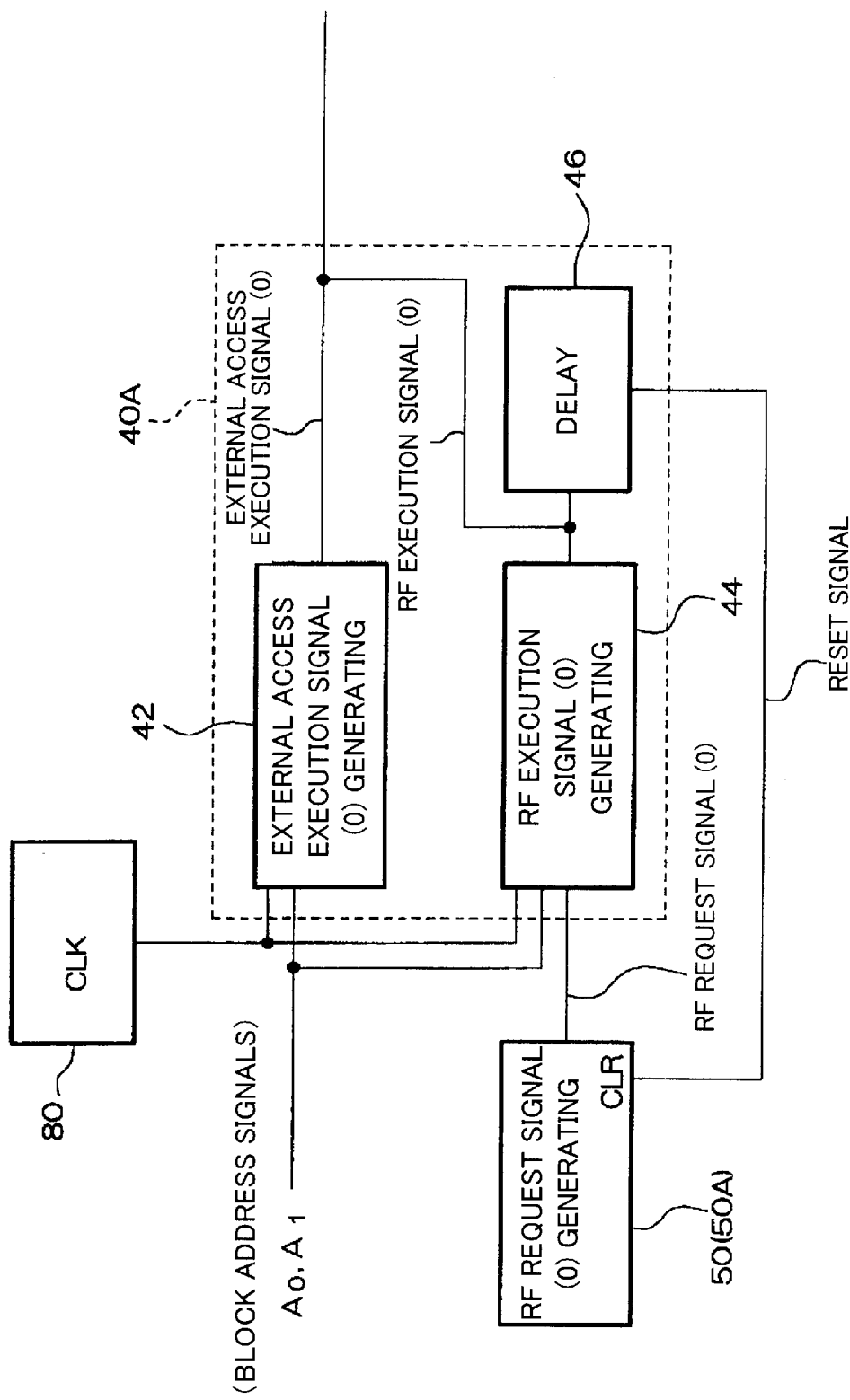
FIG. 4 is a block diagram showing a block (0) control and circuits relating to the block (0) control.

The block controls in the control section 40 are described below in detail taking the block (0) control 40A as an example. FIG. 4 is a block diagram showing the block (0) control 40A and circuits relating to the block (0) control 40A. First, the structure of the block (0) control 40A is described. The block (0) control 40A includes an external access execution signal (0) generating circuit 42, an RF execution signal (0) generating circuit 44, and a delay circuit 46.

The clock signal from the clock 80 and the block address signals $A_0$ and $A_1$ are input to the external access execution signal (0) generating circuit 42. The external access execution signal (0) generating circuit 42 outputs the external access execution signal (0) when the input block address signals $A_0$ and $A_1$ are ("L", "L"), whereby the external access execution signal (0) is output from the block (0) control 40A.

The clock signal from the clock 80, block address signals $A_0$ and $A_1$, and RF request signal (0) are input to the RF execution signal (0) generating circuit 44. The RF execution signal (0) generating circuit 44 outputs the RF execution signal (0) when the RF request signal is input in the case where the block address signals $A_0$ and $A_1$ are other than ("L", "L"), whereby the RF execution signal (0) is output from the block (0) control 40A.

Generation of the RF execution signal (0) is controlled by the block address signal ($A_0$, $A_1$) as follows. Specifically, in the case where the block address signals (AO, $A_1$) are other than ("L", "L") (signals which do not select the block (0) 22A), the RF execution signal (0) is output from the RF execution signal (0) generating circuit 44. In the case where the block address signals ($A_0$, $A_1$) are ("L", "L") (signals which select the block (0) 22A), the RF execution signal (0) is not output from the RF execution signal (0) generating circuit 44.

The RF execution signal (0) is also input to the delay circuit 46. An output signal from the delay circuit 46 is input to a clear (CLR) of the RF request signal (0) generating circuit 50A.

The operation of the block (0) control 40A is described below.

Assume that the block address signals ($A_0$, $A_1$) ("L", "L") and the RF request signal (0) are input to the block (0) control 40A. Then, the external access execution signal (0) is output from the external access execution signal (0) generating circuit 42 (example of external-access-execution-signal-generating section) in synchronization with the clock signal from the clock 80 (example of clock signal generating section) Although the RF request signal (0) is input to the RF execution signal (0) generating circuit 44 (example of refresh execution-signal-generating section), the RF execution signal (0) generating circuit 44 does not output the RF execution signal (0) since ("L", "L") of the block address signals ($A_0$, $A_1$) become masks. Therefore, the block (0) control 40A outputs the external access execution signal (0).

In the case where the block address signals ($A_0$, $A_1$) are other than ("L", "L"), when the RF request signal (0) is input to the RF execution signal (0) generating circuit 44, the RF execution signal (0) is output from the RF execution signal (0) generating circuit 44 in synchronization with the clock signal from the clock 80. However, the external access execution signal (0) generating circuit 42 outputs no signal when the block address signals are other than ("L", "L"). Therefore, the block (0) control 40A outputs the RF execution signal (0) Note that the RF execution signal (0) is also input to the delay circuit 46. The delay circuit 46 outputs a reset signal after a period of time required for refreshing (20 ns to 40 ns, for example). The RF request signal (0) is terminated by this reset signal.

Other block controls 40B to 40D have the same structure as that of the block control 40A. The operation of the block controls 40B to 40D is the same as that of the block control 40A which differs depending on whether or not the block corresponding to each block control is designated by the block address signal.

2.4 Row Predecoder

Figure 5:
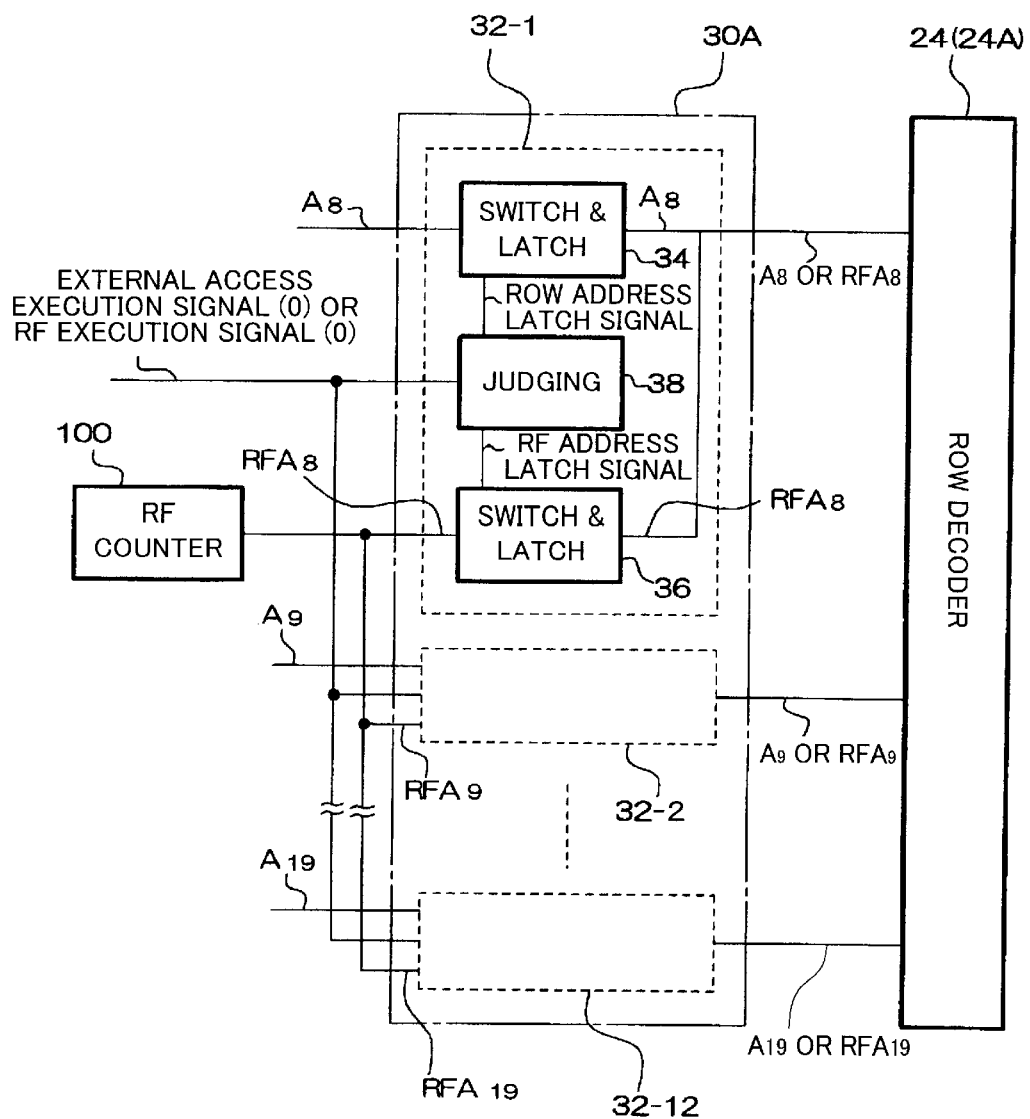
FIG. 5 is a block diagram showing a row predecoder and circuits relating to the row predecoder.

The row predecoders 30A to 30D are described below in detail taking the row predecoder 30A as an example. FIG. 5 is a block diagram showing the row predecoder 30A and circuits relating to the row predecoder 30A. The row predecoder 30A includes 12 selection blocks 32-1 to 32-12 corresponding to the number of the row address signals $A_8$ to $A_{19}$. Each of the selection blocks 32-1 to 32-12 selects the row address signal (address signal from outside) or refresh address signal.

Each of the selection blocks 32-1 to 32-12 includes switch & latch circuits 34 and 36 and a judging circuit 38. The row address signal (row address signal $A_8$ in the case of selection block 32-1) is input to the switch & latch circuit 34. The refresh address signal (refresh address signal $RFA_8$ in the case of selection block 32-1) from the RF counter 100 is input to the switch & latch circuit 36.

A signal from the block (0) control 40A (FIG. 1), specifically, external access execution signal (0) or RF execution signal (0) is input to the judging circuit 38.

When the judging circuit 38 judges that the external access execution signal (0) is input to the judging circuit 38, the judging circuit 38 outputs a row address latch signal. The row address latch signal is input to the switch & latch circuit 34, whereby the switch & latch circuit 34 latches and outputs the row address signal. Thus, the row predecoder 30A outputs the row address signals $A_8$ to $A_{19}$. These signals are used to select the word line.

When the judging circuit 38 judges that the RF execution signal (0) is input to the judging circuit 38, the judging circuit 38 outputs an RF address latch signal. The RF address latch signal is input to the switch & latch circuit 36. The switch & latch circuit 36 latches and outputs the refresh address signal. The row predecoder 30A thus outputs the refresh address signals $RFA_8$ to $RFA_{19}$. These signals are used to select the word line in a row to be refreshed.

The row predecoders 30B to 30D have the same structure as that of the row predecoder 30A. The operation of the row predecoders 30B to 30D is the same as that of the row predecoder 30A which differs depending on whether the signal from the corresponding block controls 40A to 40D is either the external access execution signal or the RF execution signal.

2.5 Refresh Operation of Semiconductor Device

Data read and write operations in the semiconductor device 1 are the same as those in a conventional SRAM (static random access memory). Therefore, description of these operations is omitted. The refresh operation of the semiconductor device 1 is described below separately for each of the operation cycle and the standby cycle.

Figure 6:
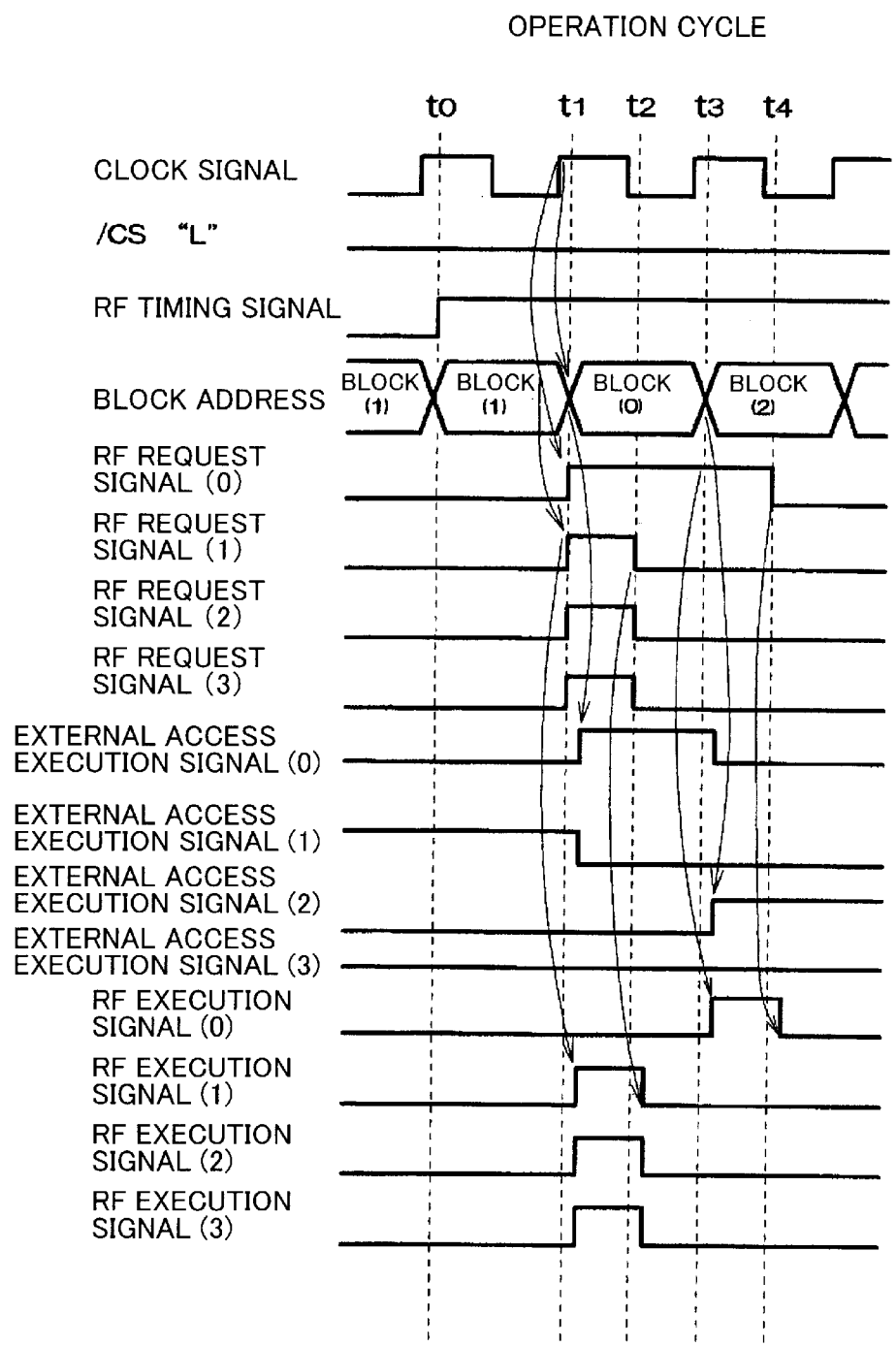
FIG. 6 is a timing chart for describing an operation cycle of the semiconductor device according to the present embodiment.

The refresh operation of the semiconductor device 1 in the operation cycle is described using FIGS. 1 and 6. FIG. 6 is a timing chart for describing the operation cycle of the semiconductor device 1. The clock signal is a signal output from the clock 80. The frequency and cycle of the clock signal are respectively 10 MHz to 20 MHz and 50 ns to 100 ns, for example. The chip-select signal /CS is set to "L", whereby the semiconductor device 1 is in the operation cycle. The block address is selected in synchronization with the leading edge of the clock signal (specifically, generation of pulse described using FIG. 3). In the present embodiment, one block 22 (example of blocks) is selected in one cycle of the clock signal. Either the same or a different block 22 is selected in the next cycle. When the clock signal from the clock 80 is input to the address buffer 60, the block address signals $A_0$ and $A_1$ are output from the address buffer 60 so that the block 22 is selected as described above.

Assume that the RF timing signal becomes "H" (active) at time $t_0$. In the case where the RF timing signal is "H", the RF request signals (0) to (3) become "H" (active) in synchronization with the first leading edge of the clock signal (time $t_1$). The block address is selected in synchronization with this leading edge of the clock signal.

The block (0) is selected at time $t_1$. Then, external access execution signal (0) is generated from the block (0) control 40A. Specifically, the external access execution signal (0) becomes "H" (active). The RF execution signals (1) to (3) are generated from other block controls 40B to 40D. Specifically, the RF execution signals (1) to (3) become "H" (active).

In the block (0), the read or write operation is performed in the selected memory cell according to the external access execution signal (0) after time $t_1$. Specifically, the read or write operation is performed in the memory cell selected by the row decoder 24A and the column decoder 26A.

Refreshing is performed in other blocks. This is described below taking the block (1) as an example. In the block (1), the memory cells connected to the word line in row n selected by the row decoder 24B is refreshed by the RF execution signal (1). Refreshing is completed at time $t_2$, whereby the RF request signal (1) becomes "L". This allows the RF execution signal (1) to become "L".

Refreshing is delayed in the block (0) 22A during a period in which the block address is the block (0). When the block address is changed from the block (0) to another block, refreshing is performed in the block (0). This is described below in detail. Assume that the block address is changed from the block (0) to the block (2) at time $t_3$. Since the RF request signal (0) is "H" (active), the RF execution signal (0) is generated from the block (0) control 40A. Specifically, the RF execution signal (0) becomes "H" (active) In the block (0) 22A, the memory cells connected to the word line in row n selected by the row decoder 24A is refreshed by the RF execution signal (0). Refreshing is completed at time $t_4$, whereby the RF request signal (0) becomes "L". This allows the RF execution signal (0) to become "L".

Refreshing of the memory cells connected to the word line in row n in the operation cycle is thus completed in the blocks (0) to (3).

Figure 7:
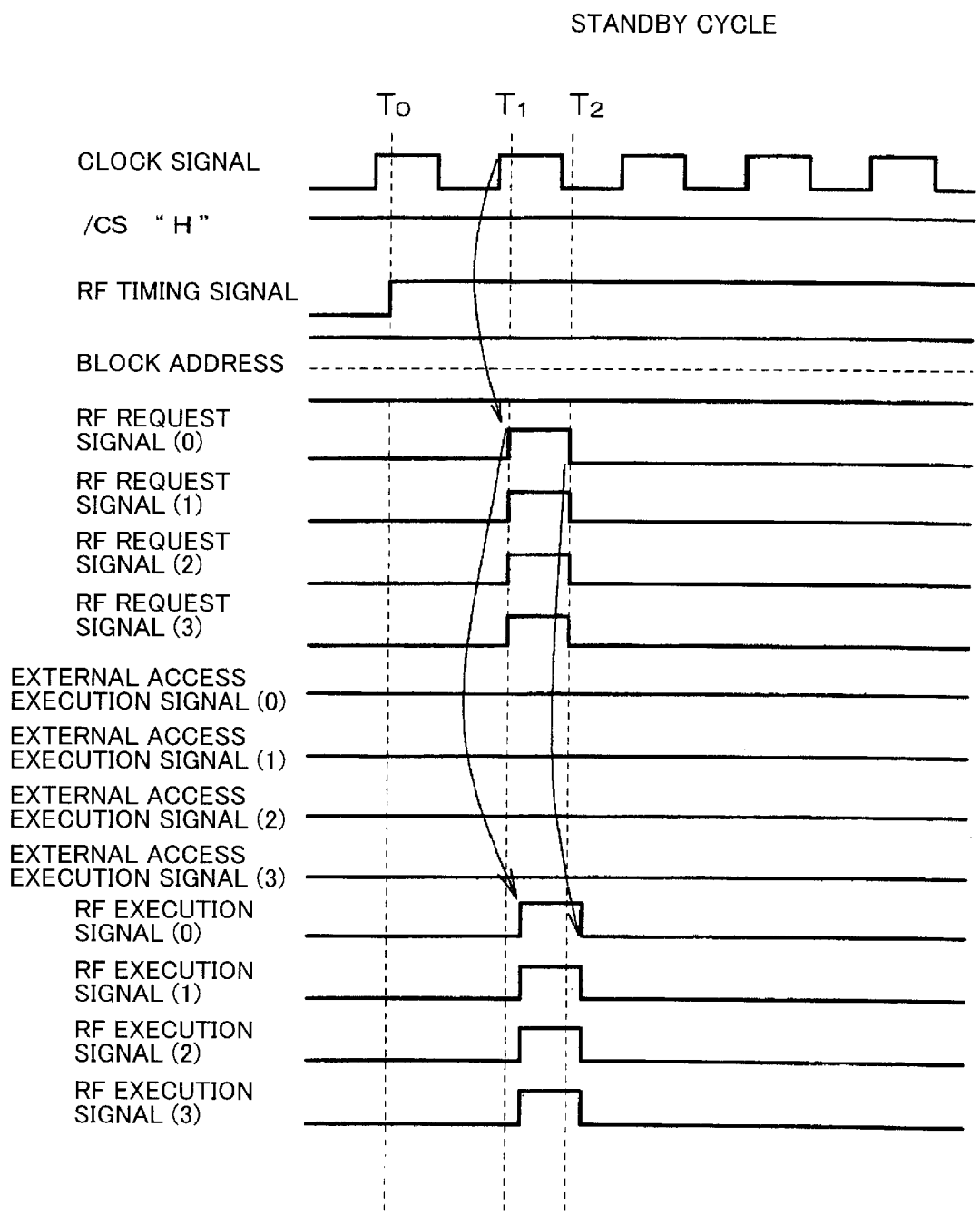
FIG. 7 is a timing chart for describing a standby cycle of the semiconductor device according to the present embodiment.

The refresh operation of the semiconductor device 1 in the standby cycle is described below using FIGS. 1 and 7. FIG. 7 is a timing chart for describing the standby cycle of the semiconductor device 1. The chip-select signal /CS is set to "H", whereby the semiconductor device 1 is in the standby cycle.

Assume that the RF timing signal becomes "H" (active) at time $T_0$. When the RF timing signal is set to "H", the RF request signals (0) to (3) become "H" (active) in synchronization with the first leading edge of the clock signal CLK (time $T_1$).

Since none of the blocks (0) to (3) is selected in the standby cycle, the RF execution signals (0) to (3) are generated from the block controls 40A to 40D. Specifically, the RF execution signals (0) to (3) become "H" (active).

Refreshing is performed in all of the blocks 20 after time $T_1$. Since this refresh operation is the same as the operation of the unselected blocks in the operation cycle, description thereof is omitted. Refreshing is completed at time $T_2$, whereby the RF request signals (0) to (3) become "L". This allows the RF execution signals (0) to (3) to become "L".

Refreshing of the memory cells connected to the word line in row n in the standby cycle is thus completed in the blocks (0) to (3).

In the present embodiment, refreshing is sequentially performed as follows by the operation of the RF counter 100. Specifically, the memory cells connected to the word line in row n are refreshed in each block 22. Then, the memory cells connected to the word line in row n+1 are refreshed in each block 22. After the memory cells connected to the word line in the final row (row 4095 in the present embodiment) are refreshed, the memory cells connected to the word line in the first row (row 0) are refreshed. This series of operations is repeated.

In the present embodiment, since refreshing is performed in the blocks 22 while the data read or write is being performed in one block 22 as shown in FIG. 6, the semiconductor device 1 can be operated efficiently.

In the present embodiment, the process for starting the data read or write in one block 22 (generation of external access execution signal) is synchronized with the process for starting refreshing in other blocks 22 (generation of RF execution signal). This prevents a problem in which refreshing is performed in one block 22 when performing the data read or write in this block 22.

In the present embodiment, the data read or write in one block 22 is synchronized with the refreshing in all other blocks 22 according to the clock signal generated from the clock 80 provided in the semiconductor device 1. Thus, refreshing is performed without taking external devices into consideration. Therefore, it is advantageous in the case of creating a system by combining the semiconductor device 1 and external devices. This system is described later in "Application examples of semiconductor device to electronic equipment".

In the present embodiment, start of the refreshing (when RF execution signal becomes "H") is synchronized with the selection of the block address, and the refresh period (period in which RF execution signal is "H", precisely, from time when RF execution signal becomes "H" to time when RF request signal becomes "L") is set to be shorter than the selection period of the block address. Therefore, refreshing is not performed in one block 22 when performing the data read or write in this block 22, thereby preventing a delay in the data read or write. Specifically, since the refresh operation is certainly completed during a non-selection period, delay in the data read or write can be prevented if the non-selected block 22 is selected. Note that the refresh period is 20 ns to 40 ns, for example. The selection period of the block address is the same as the cycle of the clock signal, such as 50 ns to 100 ns.

In the present embodiment, the block (0) 22A to the block (3) 22D are selected by the address signal $A_0$ which is the signal of the least significant bit of the address signal and the address signal $A_1$ which is the signal of the next least significant bit of the address signal. Since the address signal frequently changes as the bit order of the signal decreases, the refreshing to be continuously delayed in one block 22 can be prevented. Therefore, refresh reliability in all the blocks 22 can be increased.

2.6 RF Counter Control

In the present embodiment, refreshing is delayed in the block 22 accessed from the outside, as described above. In the present embodiment, the RF counter control 90 is provided as shown in FIG. 1, in order to ensure reliable refreshing in all the blocks 22.

The RF counter control 90 outputs the count-up signal after refreshing of the memory cells connected to the word line in row n is completed in all the blocks 22. Therefor, the counter value of the RF counter 100 is increased by one, whereby the RF counter 100 outputs the refresh address signals $RFA_8$ to $RFA_{19}$ corresponding thereto. By the output from the RF counter 100, the row predecoders 30A to 30D supplies a signal for driving the word line in row n+1.

Figure 8:
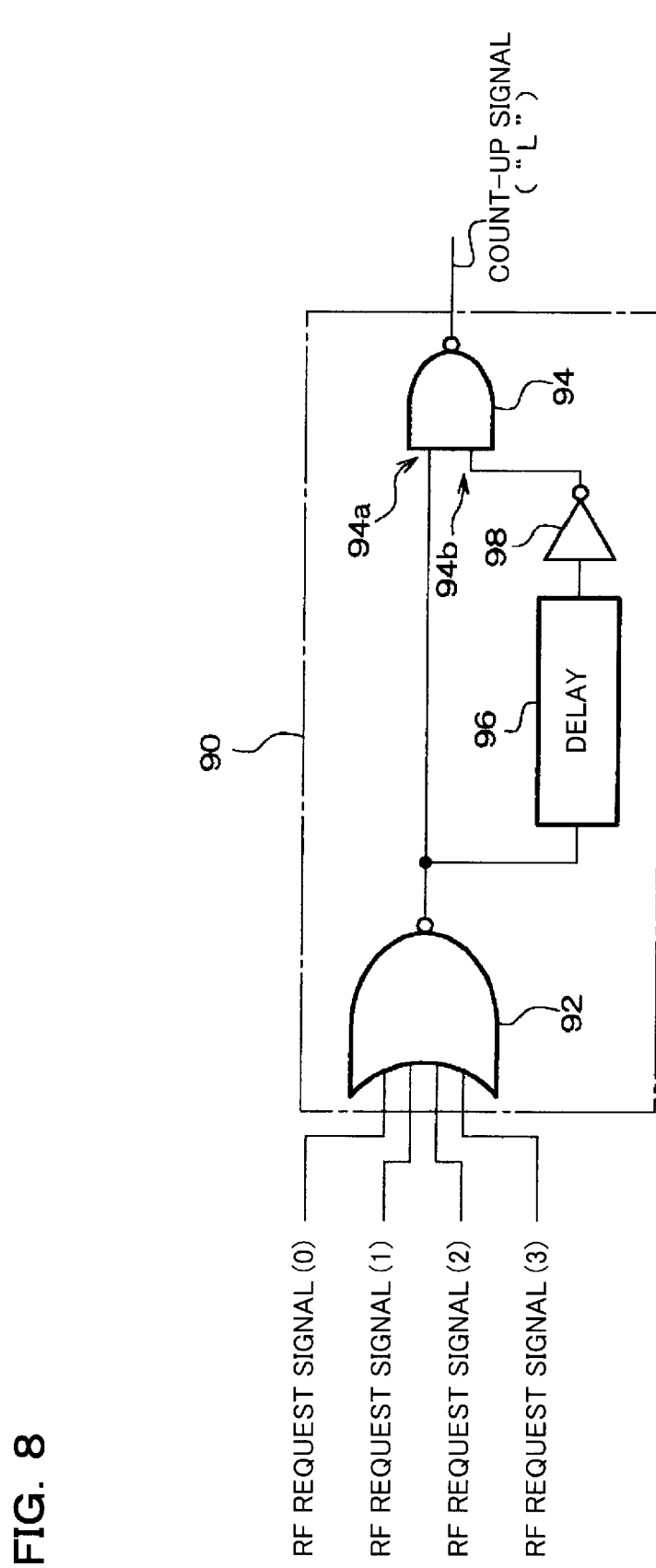
FIG. 8 is a block diagram showing an RF (refresh) counter control.

FIG. 8 is a block diagram showing the RF counter control 90. The RF counter control 90 includes a NOR gate 92, a NAND gate 94, a delay circuit 96, and an inverter 98.

The RF request signals (0) to (3) are input to the NOR gate 92. An output signal from the NOR gate 92 is input to the NAND gate 94. This signal is input through two paths. One is a path which directly connects an output terminal of the NOR gate 92 to an input terminal 94a of the NAND gate 94. The other is a path which connects the output terminal of the NOR gate 92 to an input terminal 94b of the NAND gate 94 through the delay circuit 96 and the inverter 98. An active-low count-up signal is output from the NAND gate 94.

Figure 9:
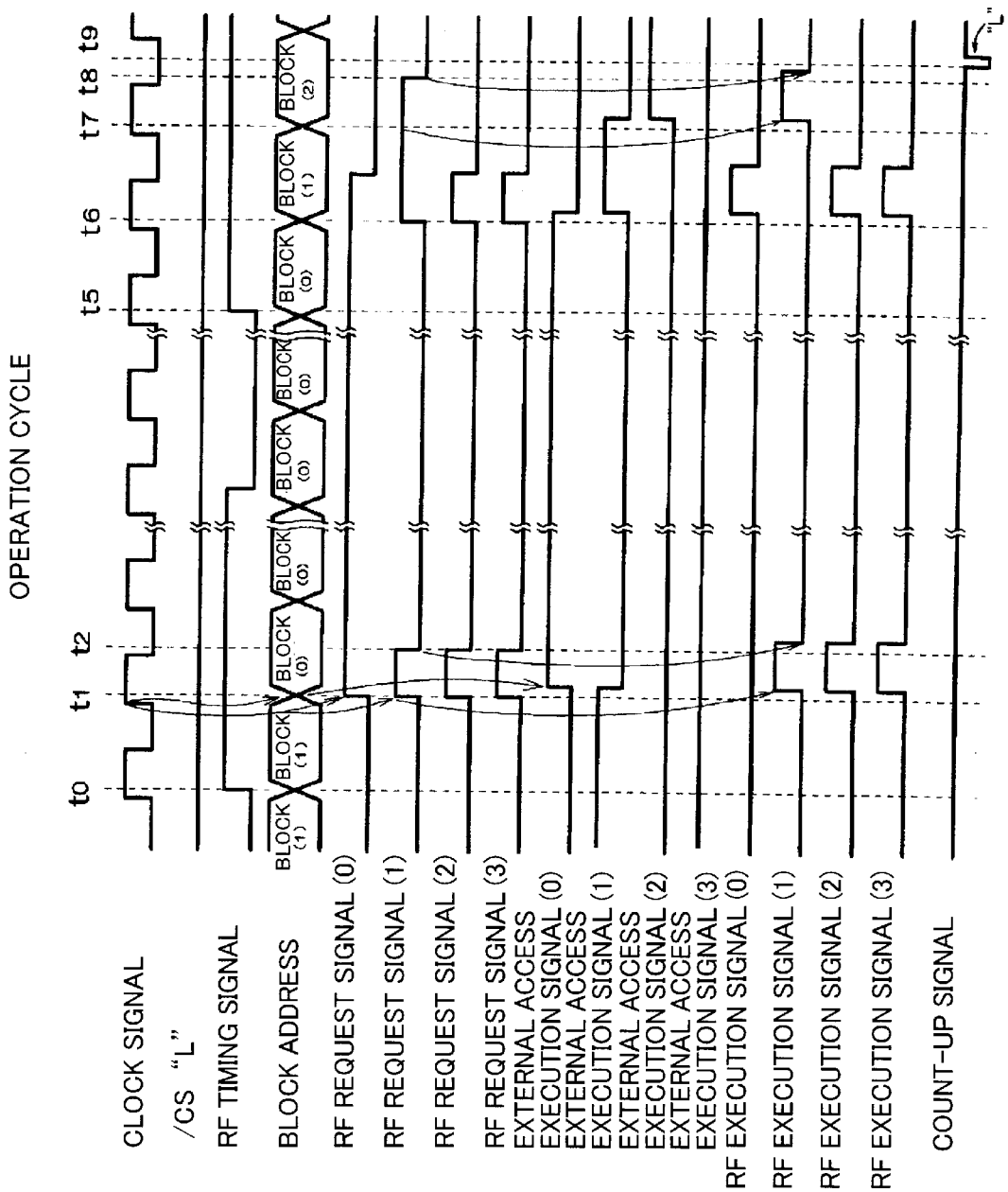
FIG. 9 is a timing chart of the semiconductor device according to the present embodiment in the operation cycle in one period.

A mechanism for the RF counter control 90 to output the count up signal is described below using FIGS. 1, 8, and 9. FIG. 9 is a timing chart of the semiconductor device 1 in the operation cycle in one period. In this period, the chip-select signal /CS is set to "L", whereby the semiconductor device 1 is in the operation cycle.

The operation of the semiconductor device 1 between time to and time $t_2$ is the same as that of the semiconductor device 1 between time $t_1$ and time $t_2$ in the timing chart shown in FIG. 6. Specifically, the memory cells connected to the word line in row n are refreshed in the block (1) 22B, block (2) 22C, and block (3) 22D.

In this example, since the block (0) 22A is continuously selected after time $t_2$, the memory cells connected to the word line in row n are not refreshed in the block (0) 22A (delay in refreshing). Therefore, the RF request signal (0) remains "H" (active). Since the RF request signal (0) is "H" in this period, the NOR gate 92 outputs the signal "L". Therefore, since the NAND gate 94 outputs the signal "H" during a period in which the block (0) 22A is continuously selected, the count-up signal is not generated.

Since the block (0) 22A is continuously selected at time $t_5$ at which the RF timing signal becomes "H" (active), the count-up signal is not generated in this RF timing signal cycle. Therefore, the memory cells connected to the word line in the same row, specifically, row n are also refreshed in this RF timing signal cycle. In more detail, after the RF timing signal becomes "H" (active) again at time $t_5$, the RF request signals (0) to (3) become "H" (active) in synchronization with the first leading edge of the clock signal CLK (time $t_6$).

Since the block (1) 22B is selected at time $t_6$, the external access execution signal (1) and the RF execution signals (0) (2), and (3) become "H" (active). Thus the memory cells connected to the word line in row n can be refreshed in the block (0) 22A, block (2) 22C, and block (3) 22D.

The block address is changed from the block (1) to the block (2) at time $t_7$. Since the RF request signal (1) is "H" (active), the RF execution signal (1) becomes "H" (active). The memory cells connected to the word line in row n are refreshed in the block (1) 22B, by the RF execution signal (1). Refreshing is completed after a specific period of time, whereby the RF request signal (1) becomes "L" (time $t_8$). Then the RF execution signal (1) becomes "L". Refreshing of the memory cells connected to the word line in row n is thus completed in the blocks (0) to (3).

Since all the RF request signals (0) to (3) become "L" at time $t_8$, the signal "H" is output from the NOR gate 92. The signal "H" is immediately input to the input terminal 94a of the NAND gate 94. Since the signal "H" is continuously input to the input terminal 94b, the count-up signal "L" (active low) is output from the NAND gate 94. The signal "H" output from the NOR gate 92 is transmitted through the delay circuit 96, converted to the signal "L" by the inverter 98, and input to the input terminal 94b. Therefore, the output from the NAND gate 94 returns "H" after the delay time by the delay circuit 96.

By means of the count-up signal, the counter value of the RF counter 100 increases by one. The RF counter 100 outputs the refresh address signal corresponding thereto. This output from the RF counter 100 for the row predecoders 30A to 30D to supply a signal for driving the word line in row n+1.

As described above, in the present embodiment, the memory cells connected to the word line in row n+1 are not refreshed until the memory cells connected to the word line in row n are refreshed in all the blocks 22. Therefore, the memory cells in all rows can be refreshed reliably.

In the case of providing the RF counter control 90, the cycle of the RF timing signal must be determined taking into consideration the normal value for refreshing (period of time in which memory cells can hold data) and the number of refresh cycles (number of word lines in each block 22: 4096 in the present embodiment). Assume that the cycle of the RF timing signal is set to 50 $\mu$s, for example, under conditions in which the normal value for refreshing is 200 ms and the number of refresh cycles is about 4000 (since the number of word lines is 4096).

$$50\ \mu s \times 4000 = 200\ ms$$

Data cannot be held under these conditions if refreshing is delayed only once. Therefore, the cycle of the RF timing signal is set to 45 $\mu$s, for example.

$$45\ \mu s \times 4000 = 180\ ms$$

$$(200\ ms - 180\ ms) \div 45\ \mu s \approx 444$$

If the cycle of the RF timing signal is set to 45 $\mu$s, data can be held even if the refreshing is delayed up to 444 times.

As shown in FIG. 9, the memory cells connected to the word line in row n have not been refreshed in the block (0) 22A in one cycle (time $t_0$ to time $t_5$) of the RF timing signal. In the present embodiment, the memory cells connected to the word line in row n (same row) are refreshed in the next cycle (after time $t_5$) of the RF timing signal. However, the present embodiment is not limited thereto. The memory cells connected to the word line in row n+1 may be refreshed.

2.7 Application Example of Semiconductor Device to Electronic Equipment

Figure 10:
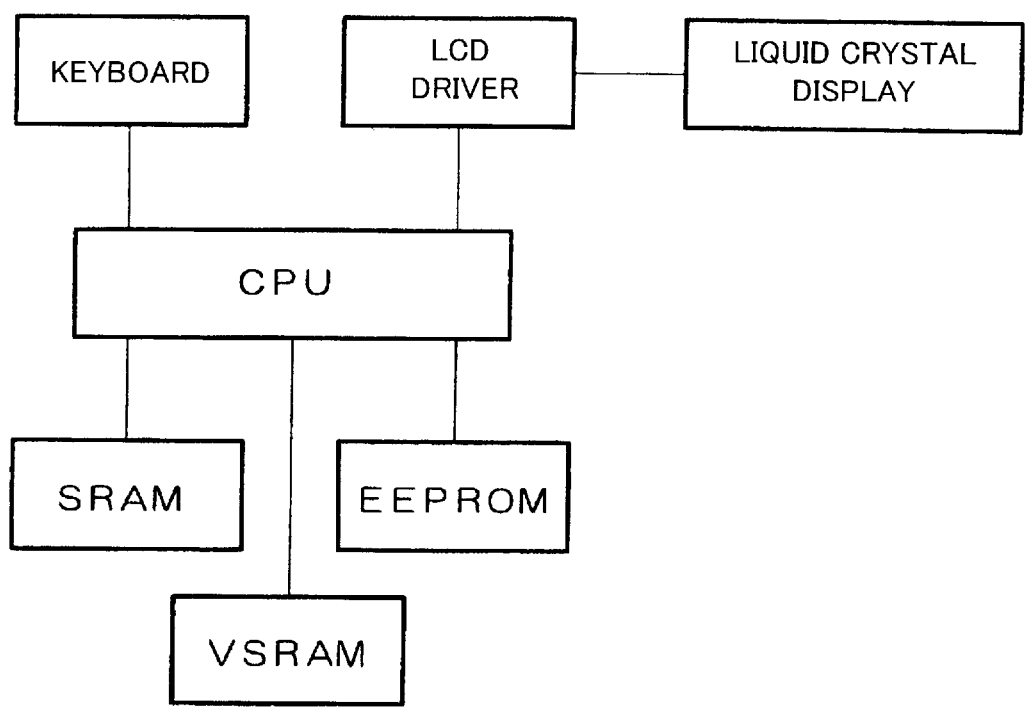
FIG. 10 is a block diagram showing part of a system for portable telephones.

The semiconductor device 1 may be applied to electronic equipment such as portable devices. FIG. 10 is a block diagram showing part of a system for portable telephones. An SRAM, VSRAM, EEPROM, keyboard, and LCD driver are connected to a CPU through a bus line. The LCD driver is connected to a liquid crystal display section through the bus line. The VSRAM shown in FIG. 10 is the semiconductor device 1.

Figure 11:
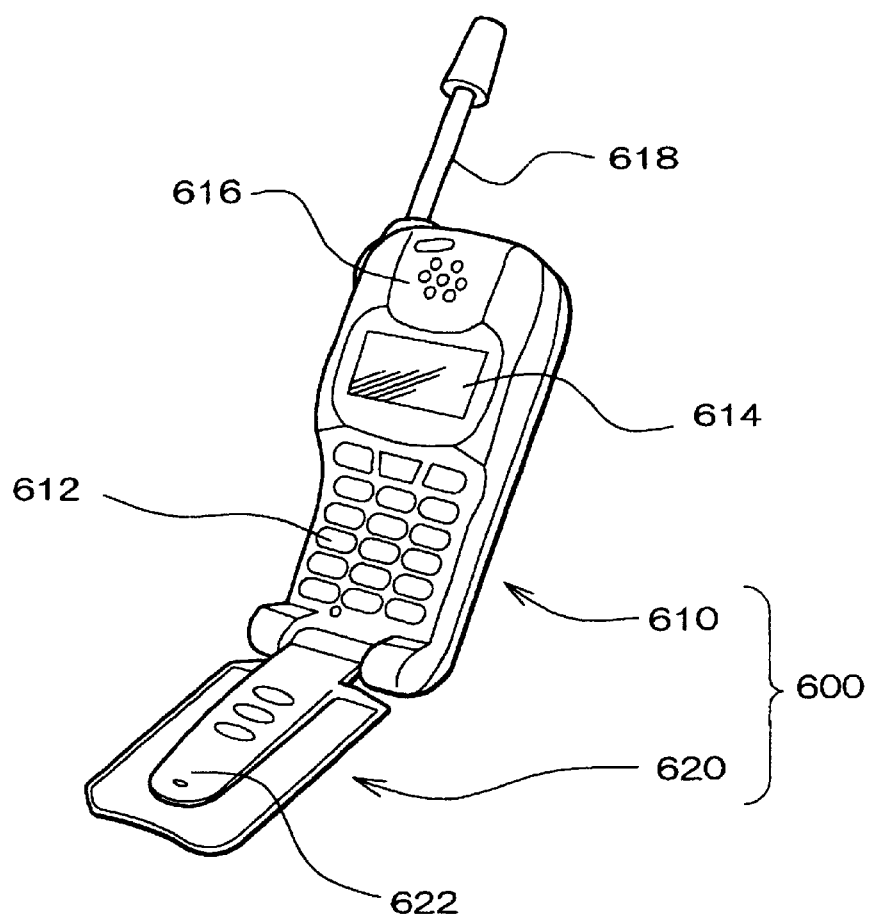
FIG. 11 is a perspective view showing a portable telephone equipped with the system for portable telephones shown in FIG. 10.

FIG. 11 is a perspective view showing a portable telephone 600 provided with the system for portable telephones shown in FIG. 10. The portable telephone 600 includes a keyboard 612, a liquid crystal display section 614, a body section 610 including a receiver section 616 and an antenna section 618, and a cover 620 including a transmitter section 622.

The embodiments of the present invention are described above. However, the present invention is not limited to the above embodiments. Various modifications and variations are possible without departing from the spirit of the present invention and within the scope of the claims.

What is claimed is:

1. A method for refreshing a semiconductor device including a memory cell array, in which memory cells for which refreshing is needed are arranged in an array, wherein said memory cell array is divided into a plurality of blocks, and data read or write in one block among said plurality of blocks is synchronized with refreshing in at least one of the other blocks among said plurality of blocks, the data read or write and the refreshing both synchronized using a single clock signal.

2. The method for refreshing a semiconductor device according to claim 1, wherein the data read or write in said one of the blocks is synchronized with the refreshing in said at least one of the other blocks using the single clock signal generated inside said semiconductor device.

3. The method for refreshing a semiconductor device according to claim 1,
wherein, during the data read or write in said one block, the refreshing is performed in said at least one of the other blocks.

4. The method for refreshing a semiconductor device according to claim 1,
wherein a process for starting the data read or write in said one block is synchronized with a process for starting the refreshing in said at least one of the other blocks.

5. The method for refreshing a semiconductor device according to claim 1,
wherein the refreshing is performed in said one block after a completion of the data read or write in said one block.

6. The method for refreshing a semiconductor device according to claim 1,
wherein the data read or write in said one block and the refreshing in all of the other blocks are performed concurrently.

7. The method for refreshing a semiconductor device according to claim 1,
wherein said semiconductor device comprises a VSRAM (Virtually Static RAM).

8. A semiconductor device including a memory cell array, in which memory cells for which refreshing is needed are arranged in an array,
wherein said memory cell array is divided into a plurality of blocks, and
the semiconductor device includes a control section which controls data read or write in one block among said plurality of blocks in synchronization with refreshing in at least one of the other blocks among said plurality of blocks, the data read or write and the refreshing both synchronized using a single clock signal.

9. The semiconductor device according to claim 8,
wherein said control section comprises a plurality of block controls of which number corresponds to the number of blocks,
wherein each of said block controls comprises:
an external-access-execution-signal-generating section which generates a first signal for directing the data read or write to be executed; and
a refresh-execution-signal-generating section which generates a second signal for directing the refreshing to be executed.

10. The semiconductor device according to claim 9,
wherein each of said block controls generates said first or second signal according to a block address signal.

11. The semiconductor device according to claim 8, further comprising:
a clock signal generating section which generates the single clock signal for the data read or write in said one block to be synchronized with the refreshing in said at least one of the other blocks.

12. The semiconductor device according to claim 8,
wherein the control section comprises:
a block selection section which selects said one block for performing the data read or write; and
a block control section for the refreshing in said at least one of the other blocks to be executed during a period in which said one block is selected.

13. The semiconductor device according to claim 8,
wherein the control section comprises:
an external-access-execution-signal-generating section which generates a first signal for directing the data read or write to be executed in said block;
a refresh-execution-signal-generating section which generates a second signal for directing the refreshing to be executed in said at least one of the other blocks; and
a clock signal generating section which generates the single clock signal for said first and second signals to be synchronized.

14. The semiconductor device according to claim 8,
wherein said control section controls the data read or write in said one block and the refreshing in all of the other blocks to be performed concurrently.

15. The semiconductor device according to claim 8, further comprising a VSRAM (Virtually Static RAM).

16. Electronic equipment comprising the semiconductor device as defined in claim 8.

* * * * *